United States Patent [19]
Young et al.

[11] Patent Number: 5,920,202
[45] Date of Patent: Jul. 6, 1999

[54] CONFIGURABLE LOGIC ELEMENT WITH ABILITY TO EVALUATE FIVE AND SIX INPUT FUNCTIONS

[75] Inventors: Steven P. Young, San Jose; Shekhar Bapat, Santa Clara; Kamal Chaudhary, Milpitas; Trevor J. Bauer, Campbell; Roman Iwanczuk, Los Gatos, all of Calif.

[73] Assignee: Xilinx, Inc., San Jose, Calif.

[21] Appl. No.: 08/835,088

[22] Filed: Apr. 4, 1997

Related U.S. Application Data

[63] Continuation-in-part of application No. 08/806,997, Feb. 26, 1997.
[51] Int. Cl.⁶ .............................. G06F 7/38; H03K 19/173
[52] U.S. Cl. ................................ 326/39; 326/37; 326/41
[58] Field of Search ................................ 326/37, 39, 40, 326/41, 47

[56] References Cited

U.S. PATENT DOCUMENTS

| Re. 34,363 | 8/1993 | Freeman . |  |
|---|---|---|---|
| 4,124,899 | 11/1978 | Birkner et al. | 364/716 |
| 4,642,487 | 2/1987 | Carter . |  |
| 4,706,216 | 11/1987 | Carter . |  |
| 4,750,155 | 6/1988 | Hsieh | 365/203 |

(List continued on next page.)

FOREIGN PATENT DOCUMENTS

| 0451798A2 | 6/1991 | European Pat. Off. . |
|---|---|---|
| 0461798A2 | 6/1991 | European Pat. Off. . |
| 0 630 115 A2 | 12/1994 | European Pat. Off. . |
| 0746107A2 | 12/1996 | European Pat. Off. . |
| 0748049A2 | 12/1996 | European Pat. Off. . |
| 2300951 | 11/1995 | United Kingdom . |
| 2 295 738 | 6/1996 | United Kingdom . |
| WO 93/05577 | 8/1992 | WIPO . |
| WO9410754 | 5/1994 | WIPO . |

OTHER PUBLICATIONS

Xilinx, Inc., "The Programmable Logic Data Book", Sep. 1996, available from Xilinx, Inc., 2100 Logic Drive, San Jose, CA 95124, pp. (4–188 to 4–190);(4–295 to 4–295); and (13–13 to 13–15).

Lucent Technologies, Microelectronics Group, ORCA, "Field–Programmable Gate Arrays Data Book," Oct. 1996, pp. 2–9 to 2–20.

Altera Corporation, "FLEX 10K Embedded Programmable Logic Family Data Sheet" from the Altera Digital Library, 1996, available from Altera Corporation, 2610 Orchard Parkway, San Jose, CA 95134–2020, pp. 31–53.

"The Programmable Logic Data Book", 1996, available from Xilinx Inc., 2100 Logic Drive, San Jose, California, 95124, pp. 4–1 to 4–49.

(List continued on next page.)

*Primary Examiner*—Michael Tokar
*Assistant Examiner*—Daniel D. Chang
*Attorney, Agent, or Firm*—Lois D. Cartier; Edel M. Young

[57] ABSTRACT

The invention provides a Configurable Logic Element (CLE) preferably included in each of an array of identical tiles. A CLE according to the invention has four function generators. The outputs of two function generators are combined with a fifth independent input in a five-input-function multiplexer or function generator to produce an output that can be any function of five inputs, or some functions of up to nine inputs. The outputs of the other two function generators are similarly combined. The outputs of the two five-input-function multiplexers or function generators are then combined with a sixth independent input in a first six-input-function multiplexer or function generator, and with a different sixth independent input in a second six-input-function multiplexer or function generator. The two six-input-function multiplexers or function generators therefore produce two outputs of which one can be any function of six inputs; the other output can be any function of six inputs provided that five inputs are shared between the two 6-input functions. Some functions of up to nineteen inputs can also be generated in a single CLE.

11 Claims, 5 Drawing Sheets

U.S. PATENT DOCUMENTS

| | | |
|---|---|---|
| 4,758,745 | 7/1988 | Elgamal et al. . |
| 4,821,233 | 4/1989 | Hsieh ............... 365/203 |
| 4,870,302 | 9/1989 | Freeman . |
| 5,001,368 | 3/1991 | Cliff et al. ............... 307/465 |
| 5,073,729 | 12/1991 | Greene et al. . |
| 5,079,451 | 1/1992 | Gudger et al. ............... 307/465 |
| 5,122,685 | 6/1992 | Chan et al. ............... 307/465 |
| 5,144,166 | 9/1992 | Camarota et al. . |
| 5,148,390 | 9/1992 | Hsieh ............... 365/95 |
| 5,157,618 | 10/1992 | Ravindra et al. ............... 364/490 |
| 5,185,706 | 2/1993 | Agrawal et al. ............... 364/489 |
| 5,198,705 | 3/1993 | Galbraith et al. ............... 307/465 |
| 5,208,491 | 5/1993 | Ebeling et al. . |
| 5,220,213 | 6/1993 | Chan et al. ............... 326/40 |
| 5,231,588 | 7/1993 | Agrawal et al. ............... 364/489 |
| 5,241,224 | 8/1993 | Pedersen et al. ............... 307/465 |
| 5,243,238 | 9/1993 | Kean . |
| 5,245,227 | 9/1993 | Furtek et al. ............... 307/465 |
| 5,258,668 | 11/1993 | Cliff ............... 307/465 |
| 5,260,610 | 11/1993 | Pedersen et al. . |
| 5,260,611 | 11/1993 | Cliff et al. . |
| 5,260,881 | 11/1993 | Agrawal et al. . |
| 5,267,187 | 11/1993 | Hsieh et al. . |
| 5,280,202 | 1/1994 | Chan ............... 307/465 |
| 5,313,119 | 5/1994 | Cooke et al. ............... 307/465.1 |
| 5,317,209 | 5/1994 | Garverick et al. ............... 307/465 |
| 5,319,255 | 6/1994 | Garverick et al. ............... 307/272.3 |
| 5,323,069 | 6/1994 | Smith, Jr. ............... 307/465 |
| 5,333,279 | 7/1994 | Dunning ............... 395/325 |
| 5,343,406 | 8/1994 | Freeman et al. ............... 364/490 |
| 5,347,519 | 9/1994 | Cooke et al. ............... 371/22.2 |
| 5,349,250 | 9/1994 | New ............... 326/39 |
| 5,357,153 | 10/1994 | Chiang et al. . |
| 5,359,242 | 10/1994 | Veenstra ............... 307/465 |
| 5,365,125 | 11/1994 | Goetting et al. . |
| 5,414,377 | 5/1995 | Freidin ............... 326/41 |
| 5,455,525 | 10/1995 | Ho et al. . |
| 5,457,410 | 10/1995 | Ting . |
| 5,469,003 | 11/1995 | Kean . |
| 5,481,206 | 1/1996 | New et al. ............... 326/38 |
| 5,500,609 | 3/1996 | Kean ............... 326/41 |
| 5,504,440 | 4/1996 | Sasaki ............... 326/39 |
| 5,537,057 | 7/1996 | Leong et al. ............... 326/41 |
| 5,543,732 | 8/1996 | McClintock et al. ............... 326/41 |
| 5,546,018 | 8/1996 | New et al. ............... 326/38 |
| 5,546,596 | 8/1996 | Geist ............... 395/200.02 |
| 5,581,199 | 12/1996 | Pierce et al. . |
| 5,583,450 | 12/1996 | Trimberger et al. ............... 326/41 |
| 5,629,886 | 5/1997 | New . |
| 5,635,851 | 6/1997 | Tavana ............... 326/27 |
| 5,646,546 | 7/1997 | Bertolet et al. ............... 326/39 |
| 5,682,107 | 10/1997 | Tavana et al. ............... 326/41 |
| 5,724,276 | 3/1998 | Rose et al. ............... 364/716.06 |
| 5,740,069 | 4/1998 | Agrawal et al. ............... 326/47 |
| 5,760,604 | 6/1998 | Pierce et al. ............... 326/41 |

OTHER PUBLICATIONS

Neil H. E. Weste and Kamran Eshraghian, "Principles of CMOS VLSI: A System Approach", by AT&T Bell Laboratories, Inc, published by Addison–wesley Publishing Company, copyright 1985, p. 56.

"The Programmable Gate Array Data Book", 1989, available from Xilinx Inc., 2100 Logic Drive, San Jose, California, 95124, pp. 6–30 through 6–44.

"The Programmable Logic Data Book", 1993, available from Xilinc Inc., 2100 Logic Drive, San Jose, Califorinia, 95124, pp. 1–1 through 1–7; 2–1 through 2–42; 2–97 through 2–130; and 2–177 through 2–204.

Luis Morales, "Boundary Scan in XC4000 Devices", XAPP 017.001, Oct. 1992, pp. 2–108 and 2–180.

CONFIGURABLE LOGIC ELEMENT WITH ABILITY TO EVALUATE FIVE AND SIX INPUT FUNCTIONS

CROSS-REFERENCE TO RELATED APPLICATIONS

This application is a continuation-in-part of U.S. patent application Ser. No. 08/806,997 invented by Steven P. Young, Kamal Chaudhary, and Trevor J. Bauer entitled "FPGA REPEATABLE INTERCONNECT STRUCTURE WITH HIERARCHICAL INTERCONNECT LINES" and filed Feb. 26, 1997, which is incorporated herein by reference.

This application further relates to the following commonly assigned co-pending U.S. patent applications:

1. Ser. No. 08/786,818 invented by Kenneth D. Chapman and Steven P. Young, entitled "CONFIGURABLE LOGIC BLOCK WITH AND GATE FOR EFFICIENT MULTIPLICATION IN FPGAs" and filed Jan. 21, 1997,
2. Ser. No. 08/754,421 invented by Trevor J. Bauer, entitled "LOOKUP TABLES WHICH DOUBLE AS SHIFT REGISTERS" and filed Nov. 22, 1996, and
3. Ser. No. 08/494,131 invented by Bernard J. New, entitled "METHOD AND STRUCTURE FOR PROVIDING FAST PROPAGATION OF A CARRY SIGNAL IN A FIELD PROGRAMMABLE GATE ARRAY" and filed Jun. 23, 1995, all of which are incorporated herein by reference.

BACKGROUND OF THE INVENTION

1. Field of the Invention

The invention relates to programmable integrated circuit devices, more particularly to a Configurable Logic Element (CLE) in a field programmable logic device.

2. Description of the Background Art

Field Programmable Gate Arrays (FPGAs) typically include an array of tiles. Each tile includes a Configurable Logic Element (CLE) connectable to CLEs in other tiles through programmable interconnect lines. The interconnect lines typically provide for connecting each CLE to each other CLE.

CLEs typically include combinatorial function generators, which are often implemented as 4-input lookup tables.

Some CLEs can also implement any 5-input function by selecting between the outputs of two 4-input function generators with another CLE input. One such CLE, implemented in the Xilinx XC4000-Series FPGAs, is described in pages 4–11 through 4–23 of the Xilinx 1996 Data Book entitled "The Programmable Logic Data Book", available from Xilinx, Inc., 2100 Logic Drive, San Jose, Calif. 95124, which are incorporated herein by reference. (Xilinx, Inc., owner of the copyright, has no objection to copying these and other pages referenced herein but otherwise reserves all copyright rights whatsoever.) A portion of an XC4000-Series CLE implementing a 5-input function generator is shown in FIG. 1. The outputs F' and G' of the two function generators F and G can be optionally combined with a third signal H1 in a third function generator 3H to form output 3H'. The 3H function generator can implement any function of the three inputs (256 functions), including a 2-to-1 multiplexer that can be used when a 5-input function is desired. When function generators F and G share the same four inputs (F1/G1, F2/G2, F3/G3, F4/G4) and function generator 3H is programmed to function as a 2-to-1 multiplexer, output 3H' can represent any function of up to five inputs (F1/G1, F2/G2, F3/G3, F4/G4, H1). When the inputs to function generators F and G are independent, output 3H' can represent some functions of up to nine inputs (F1, F2, F3, F4, G1, G2, G3, G4, H1).

Function generator 3H can be replaced by a 2-to-1 multiplexer, with signal H1 selecting between outputs F' and G', as disclosed in U.S. Pat. No. 5,349,250 entitled "Logic Structure and Circuit for Fast Carry" by Bernard J. New, which is incorporated herein by reference. Replacing the function generator of FIG. 1 with a 2-to-1 multiplexer reduces the number of supported functions with up to nine inputs, but still provides any function of up to five inputs and reduces the silicon area required to implement a five-input-function generator. An FPGA using two 4-input function generators and a 2-to-1 multiplexer to implement a five input function generator is the XC5200 family of products from Xilinx, Inc. The XC5200 CLE is described in pages 4-188 through 4-190 of the Xilinx 1996 Data Book entitled "The Programmable Logic Data Book", available from Xilinx, Inc., 2100 Logic Drive, San Jose, Calif. 95124, which are incorporated herein by reference.

A CLE capable of generating 6-input functions is described as implemented in the ORCA™ OR2C FPGAs from Lucent Technologies Inc. ("ORCA" is a trademark of Lucent Technologies Inc.) This CLE is described in pages 2–9 through 2–20 of the Lucent Technologies October 1996 Data Book entitled "Field-Programmable Gate Arrays", available from Microelectronics Group, Lucent Technologies Inc., 555 Union Boulevard, Room 30L-15P-BA, Allentown, Pa. 18103, which are incorporated herein by reference. A portion of an ORCA OR2C CLE implementing a 6-input function generator is shown here in FIG. 2. The CLE of FIG. 2 comprises four 4-input function generators QLUT0, QLUT1, QLUT2, QLUT3. Function generator QLUT0 has four inputs B0, B1, B2, B3 and function generator QLUT1 has four inputs B1, B2, B3, B4. Outputs QL0 and QL1 of function generators QLUT0 and QLUT1, respectively, can be selected between in 2-to-1 multiplexer MUX0 with CLE input signal B4 acting as a select line to form output M0. Multiplexer MUX0 therefore can provide functions of five input signals B0, B1, B2, B3, B4. Similarly, function generator QLUT2 has four inputs A0, A1, A2, A3 and function generator QLUT3 has four inputs A1, A2, A3, A4. Outputs QL2 and QL3 of function generators QLUT2 and QLUT3, respectively, can be optionally combined in 2-to-1 multiplexer MUX3 with CLE input signal A4 acting as a select line to form output M3. Multiplexer MUX3 therefore can provide functions of five input signals A0, A1, A2, A3, A4. Multiplexer outputs M0 and M3 can optionally be combined in 2-to-1 multiplexer MUX6 with CLE input signal C0 acting as a select line to form output M1. When input signals A0, A1, A2, A3, A4 are shared with input signals B0, B1, B2, B3, B4, respectively, multiplexer output M1 can represent functions of up to six inputs (A0/B0, A1/B1, A2/B2, A3/B3, A4/B4, C0).

One advantage of including four function generators in a single CLE is the ability to implement circuits requiring three or four function generators, such as 6-input functions, in a single CLE, thereby improving the performance of the circuit. (Connections between CLE outputs and inputs are typically slower than internal connections within a single CLE.) However, one disadvantage is that the resulting software model for the CLE is more complicated than the software model for a smaller, simpler CLE. FPGA mapping, placing, routing, and delay estimation software tools require a CLE software model in order to implement a user's design.

The more complicated the CLE software model, the more complicated it becomes to write the mapping, placing, routing, and delay estimation software, and the longer the software takes to run. Therefore, it is desirable to increase the number of function generators in a CLE without increasing the complexity of the software model.

Additionally, the amount of logic that can be placed in an FPGA is often limited by the amount of interconnect available, particularly in high-density designs (i.e., designs using a high percentage of the available logic blocks). Adding enough interconnect lines to support high-density designs allows a larger percentage of the available logic blocks to be used, but is costly in terms of silicon area because of the silicon required to programmably interconnect the lines. The silicon area for the extra interconnect lines is wasted for designs that do not require the extra interconnect lines. It is therefore desirable to minimize the number of required interconnect lines, rather than adding additional lines for high-density designs.

SUMMARY OF THE INVENTION

The invention provides a Configurable Logic Element (CLE) preferably included in each of an array of identical tiles. A CLE according to the invention has four 4-input function generators. The outputs of first and second function generators are combined with a fifth independent input in a five-input-function multiplexer or function generator to produce an output that can be any function of five inputs. Additionally, the multiplexer or function generator can provide some functions of up to nine inputs, since none of the inputs are shared. One 6-input function that is particularly useful is a 4-to-1 multiplexer, which is a function frequently used in FPGA customer designs. The outputs of the third and fourth function generators are similarly combined.

The outputs of the two five-input-function multiplexers or function generators are then combined with a sixth independent input in a first six-input-function multiplexer or function generator, and with a different sixth independent input in a second six-input-function multiplexer or function generator. The two six-input-function multiplexers or function generators therefore produce two outputs. One of the outputs can be any function of six inputs; the other output can be a related function of six inputs, where five inputs and two five-input-function multiplexers or function generators are shared between the two 6-input functions. Some functions of up to nineteen inputs can also be generated in a single CLE, since none of the inputs are shared. One 11-input function that is particularly useful is an 8-to-1 multiplexer, which is a function frequently used in FPGA customer designs. The CLE of the invention is believed to be the first CLE able to generate an 8-to-1 multiplexer using only four 4-input function generators. When the sixth input is also shared, the two 6-input functions are the same, and the same output signal appears at two exit points on the CLE.

One method of minimizing the number of required interconnect lines in an FPGA is to provide additional exit points for CLE outputs. When two exit points are provided, an output signal can use either exit point, and therefore has a wider choice of interconnect paths than when restricted to one exit point. It is also easier for the software to route the signal, and fewer of the available interconnect lines need be used. In a CLE according to the invention, multiple exit points for a six-input-function output are provided.

Similarly, multiple entry points for CLE input signals improve routing flexibility. Since either of two six-input function generators can be used, each having one input independent of the other, logic can be placed in the six-input function generator having the most desirable input connection.

In one embodiment, the CLE is organized into two similar portions called "slices", each slice comprising two function generators, one five-input-function multiplexer, and one six-input-function multiplexer. The two slices are symmetric, and in one embodiment are laid out as mirror images of each other. Therefore, a software model for a single slice can be used by the FPGA mapping, placing, routing, and delay estimation software, resulting in a much simpler model than would be required to model the entire CLE. A simpler model decreases software runtime and simplifies the software development process. Additionally, using a similar layout for the two slices results in approximately equal delays between corresponding nodes in the two slices of the CLE and also provides a considerable saving to the FPGA vendor of time and money during the design cycle. Further, when the same layout is used for both slices the CLE is the same size with two six-input-function multiplexers as it would be if only one six-input-function multiplexer were provided. Therefore, in this embodiment, the second six-input-function multiplexer provides several benefits while using little or no additional silicon area.

In other embodiments, either the five-input-function multiplexers, the six-input-function multiplexers, or both, have additional inputs, thereby further increasing the number of functions that can be implemented in the CLE. In other embodiments, the number of functions supported by the CLE is increased by using 3-input function generators instead of the five-input-function multiplexers, the six-input-function multiplexers, or both.

DETAILED DESCRIPTION OF THE DRAWINGS

A First CLE According to the Invention

Figure 1:
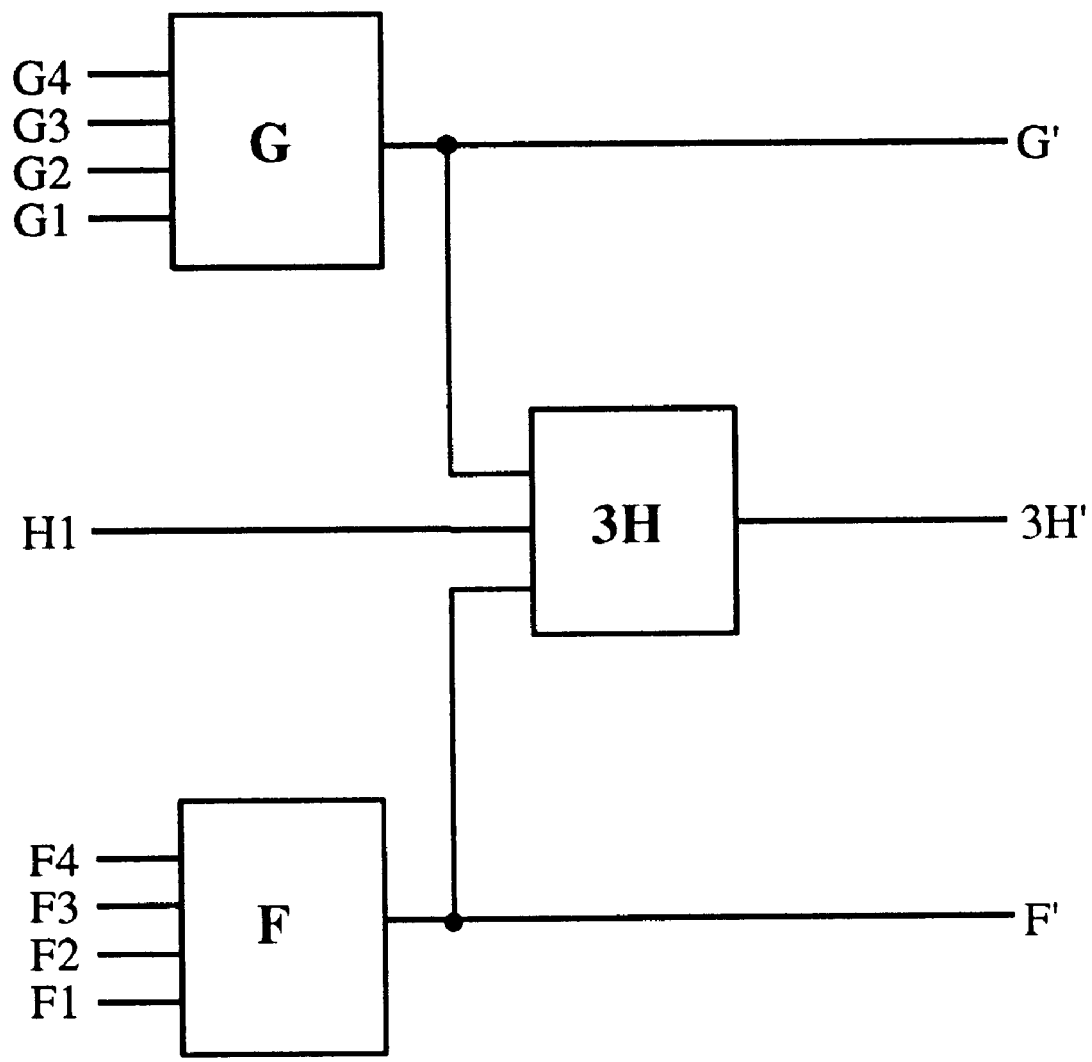
FIG. 1 shows a portion of a prior art CLE that can evaluate 5-input functions.
Figure 2:
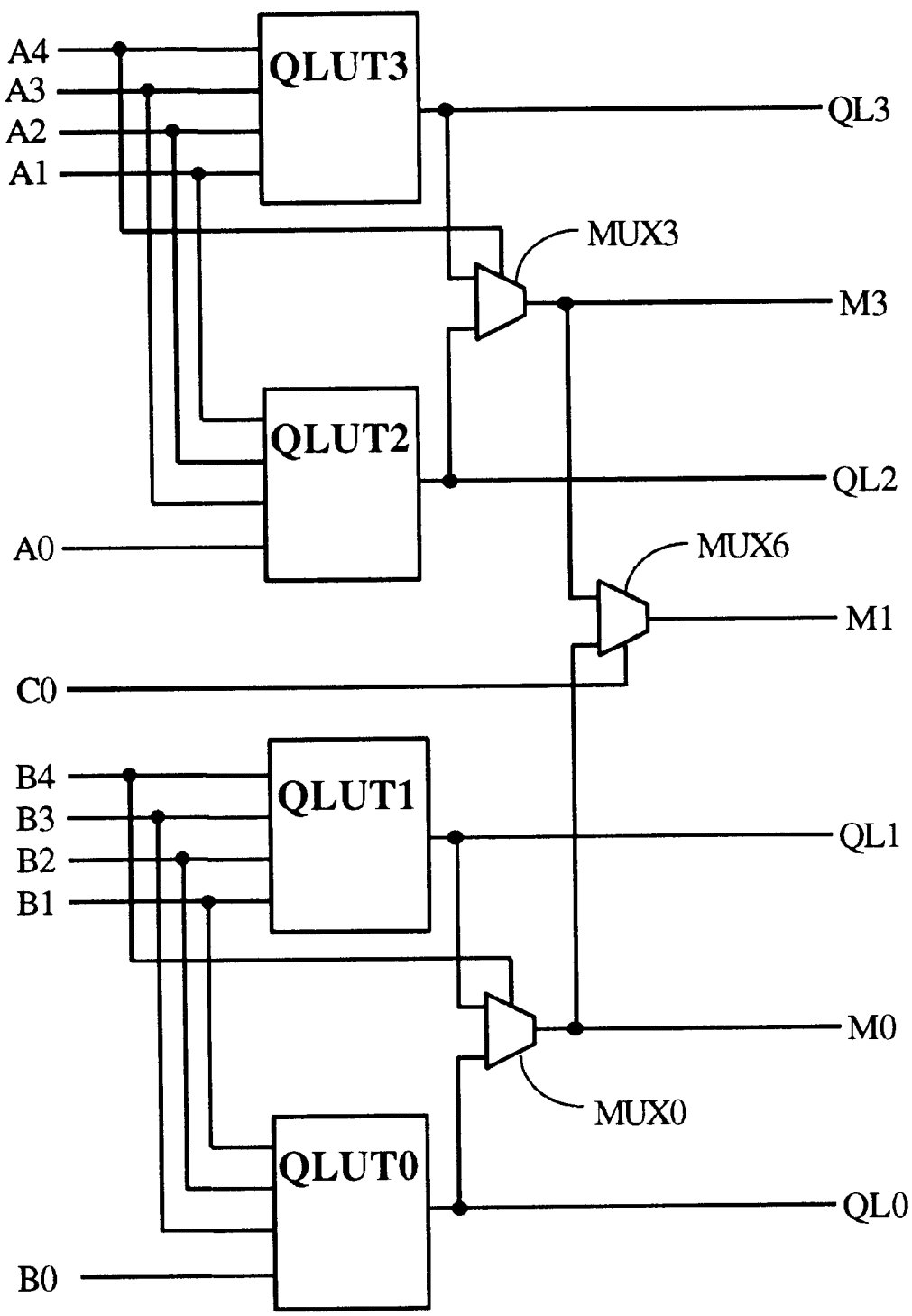
FIG. 2 shows a portion of a prior art CLE that can evaluate 6-input functions.
Figure 3:
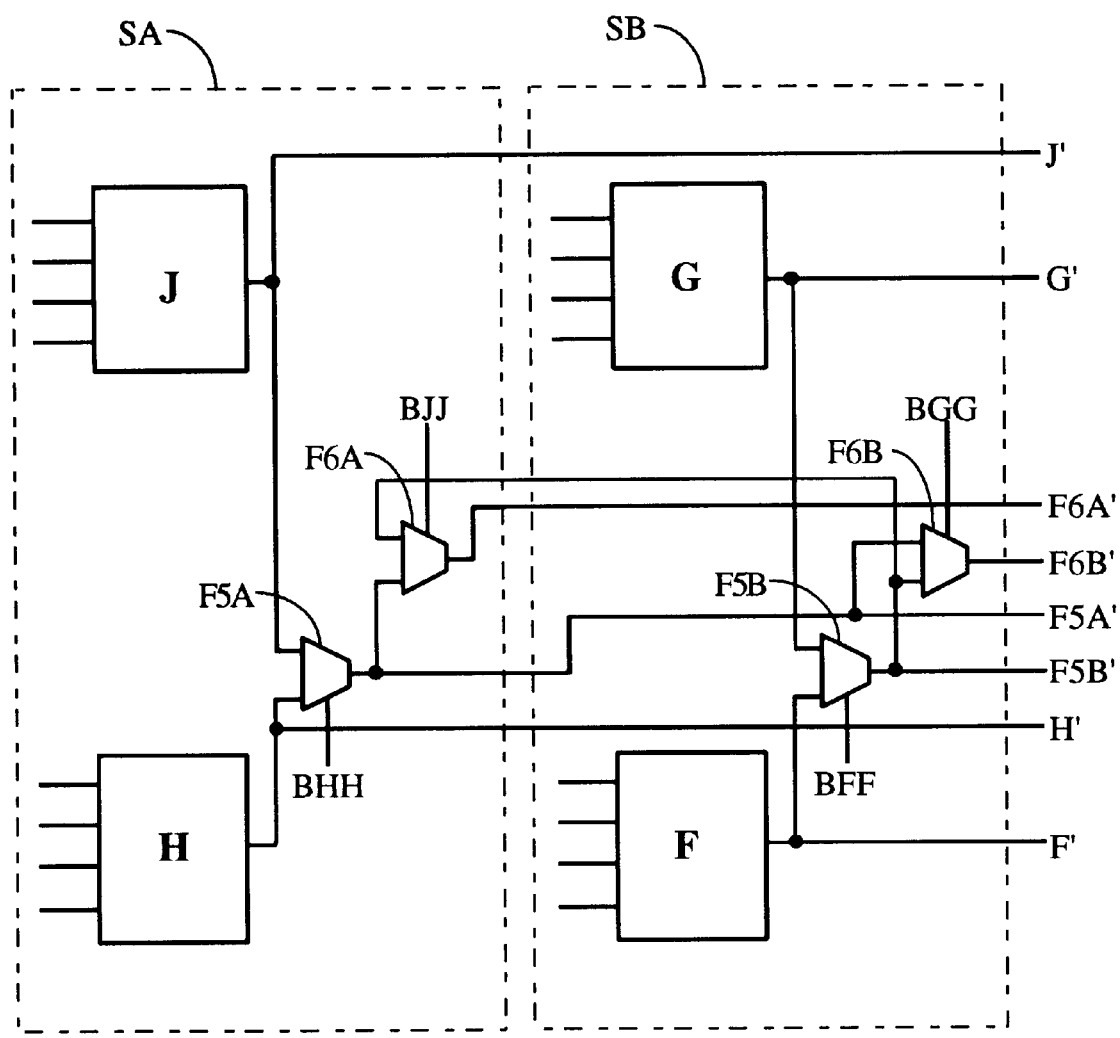
FIG. 3 shows the function generators and multiplexers for a single CLE according to a first embodiment of the invention.

FIG. 3 shows a simplified block diagram of a portion of a first CLE according to the invention. Included in FIG. 3 are four 4-input function generators F, G, H, J. The outputs of function generators F and G (F' and G', respectively) are combined with a fifth independent input BFF in five-input-function multiplexer F5B to produce output F5B', which can be any function of five inputs, or some functions of up to nine inputs. The outputs of function generators H and J (H' and J', respectively) are combined with a fifth independent input BHH in five-input-function multiplexer F5A to produce output F5A', which can be any function of five inputs, or some functions of up to nine inputs. The outputs F5A' and F5B' of five-input-function multiplexers F5A and F5B are combined with a sixth independent input BGG in a first six-input-function multiplexer F6B, and with a different sixth independent input BJJ in a second six-input-function multiplexer F6A. The two six-input-function multiplexers F6A and F6B therefore produce two outputs F6A' and F6B', respectively. One of outputs F6A' and F6B' can be any function of six inputs; the other output can be any function of six inputs provided that five inputs are shared between the two 6-input functions. Some functions of up to nineteen inputs can also be generated in a single CLE.

The CLE of FIG. 3 can be viewed as two slices SA, SB. Each slice SA, SB comprises two 4-input function generators (H and J, F and G, respectively), one five-input-function multiplexer (F5A, F5B, respectively), and one six-input-function multiplexer (F6A, F6B, respectively).

A Second CLE According to the Invention

Figure 4A:
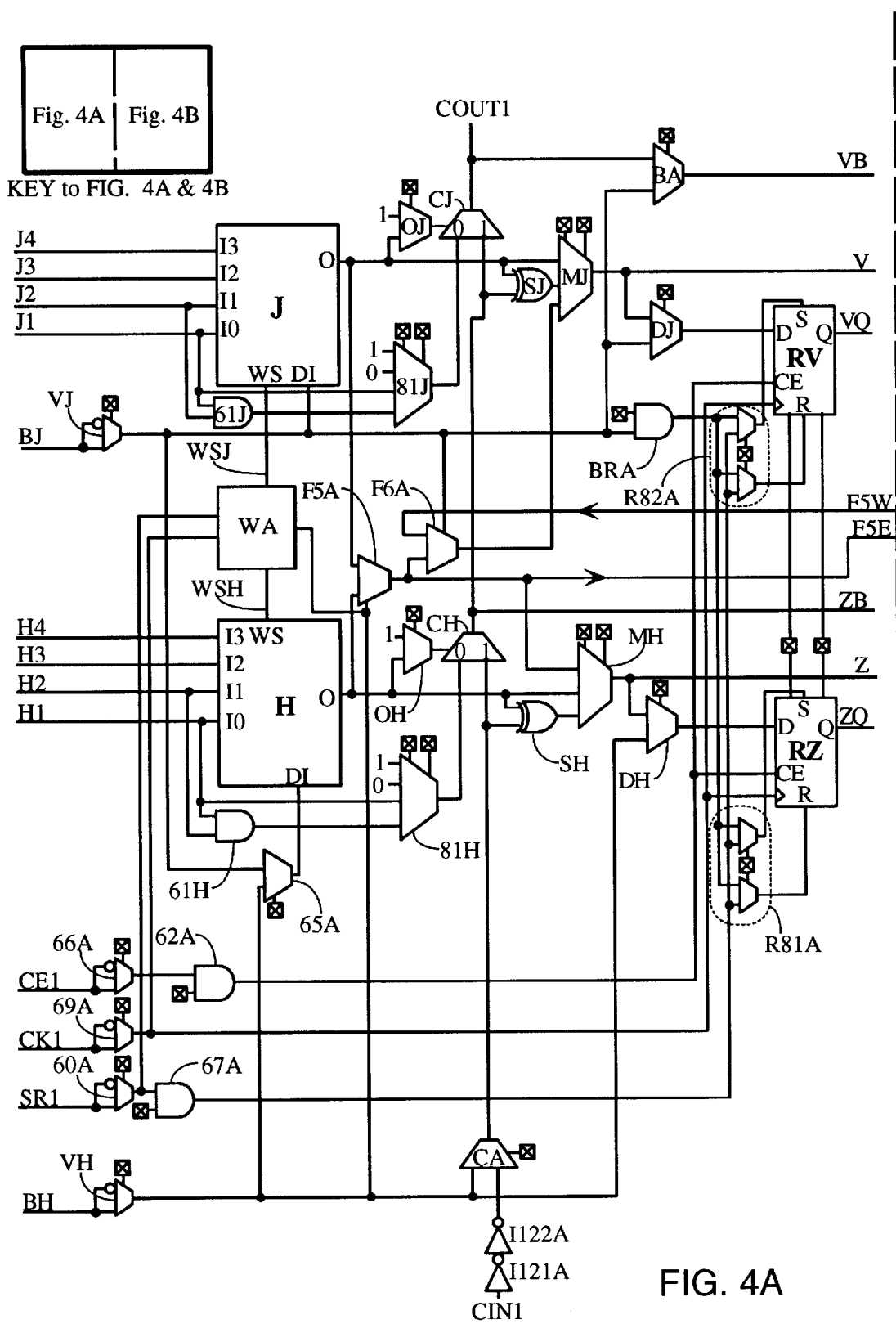
FIGS. 4A and 4B show the internal logic for one CLE according to a second embodiment of the invention. To view the entire CLE, FIGS. 4A and 4B must be viewed together as shown in the key at the top of FIG. 4A.
Figure 4B:
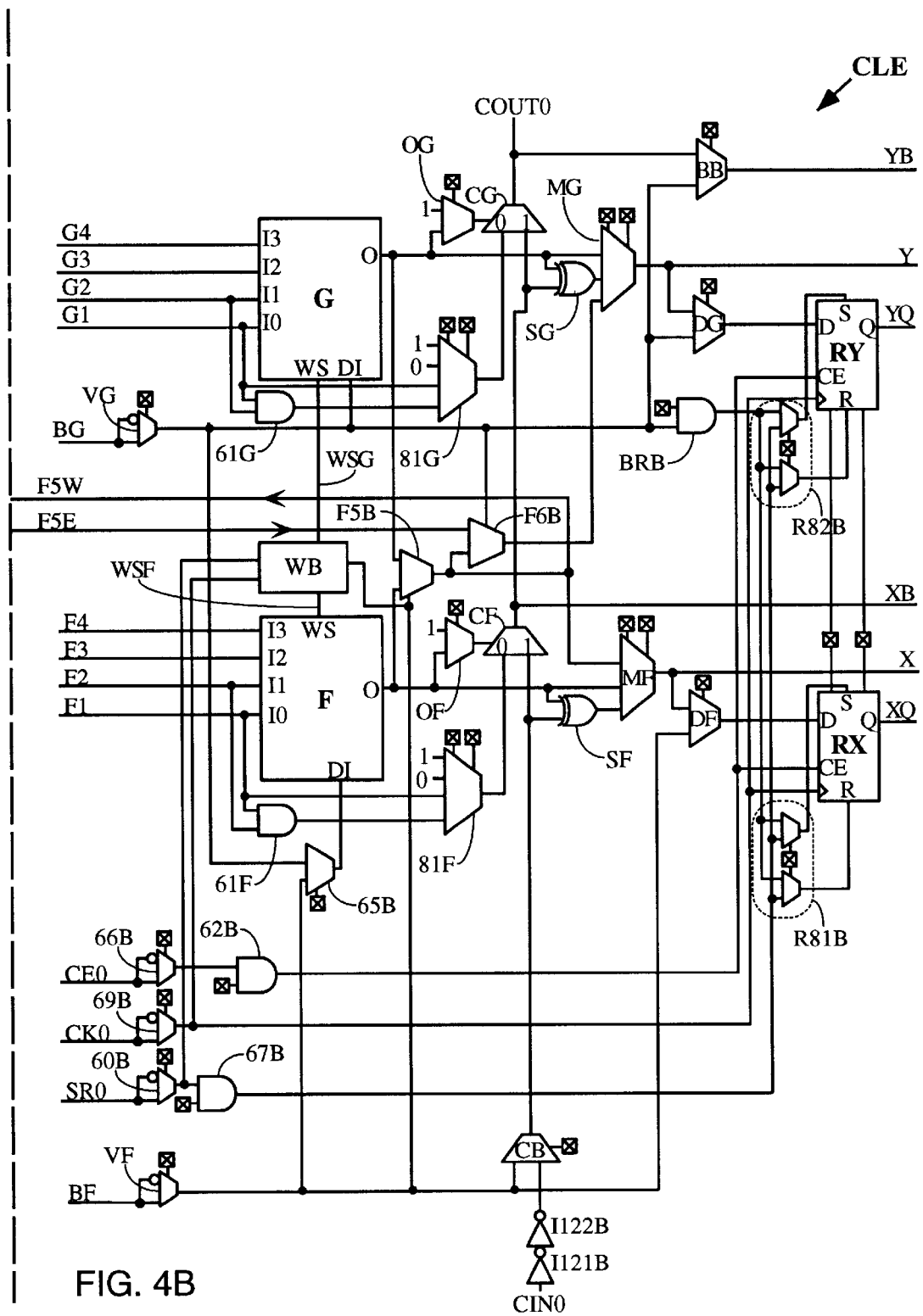

A second CLE in accordance with the invention is shown in FIGS. 4A and 4B. In this embodiment, the CLE is implemented in two slices. To view the entire CLE, FIGS. 4A and 4B, each showing one slice, must be viewed together as shown in the key at the top of FIG. 4A. Programmable (configurable) bits controlling the function of the CLE are shown as small boxes containing an "x".

The details of one function generator compatible with the CLE of the invention are shown and described in commonly assigned, co-pending U.S. application Ser. No. 08/786,818 entitled "Configurable Logic Block with AND Gate for Efficient Multiplication in FPGAs" by Chapman et al, which is referenced above and incorporated herein by reference.

The CLE of FIGS. 4A and 4B includes four function generators: F and G in FIG. 4B, and H and J in FIG. 4A. Function generator F has four inputs F1, F2, F3, F4; function generator G has four inputs G1, G2, G3, G4; function generator H has four inputs H1, H2, H3, H4; and function generator J has four inputs J1, J2, J3, J4. Each of function generators F, G, H, J also has a data-in input DI and an output O. In addition, each function generator F, G has a write strobe WS input WSF, WSG, respectively, generated in write strobe generator WB from clock input signal CK0 optionally inverted by multiplexer 69B, set/reset input signal SR0 optionally inverted by multiplexer 60B, and input signal BF optionally inverted by multiplexer VF. Each function generator H, J has a write strobe WS input WSH, WSJ, respectively, generated in write strobe generator WA from clock input signal CK1 optionally inverted by multiplexer 69A, set/reset input signal SR1 optionally inverted by multiplexer 60B, and input signal BH optionally inverted by multiplexer VH.

Function generators F, G, H, J of FIGS. 4A and 4B preferably include novel features described by Bauer in commonly assigned, co-pending U.S. patent application Ser. No. 08/754,421 entitled "Lookup Tables Which Double as Shift Registers", which is referenced above and incorporated herein by reference. Briefly, these function generators have the ability to operate as shift registers as well as small RAMs and lookup tables. Write strobe signal WS controls the shifting function and the RAM write cycle. (In one embodiment, write strobe signal WS is implemented as two separate control signals, as described by Bauer.) Data-in port DI carries a data signal (in this embodiment derived from input signals BF, BH, BG, BJ) for writing to an addressed memory cell. When function generators F, G, H, J are configured as shift registers as described by Bauer, the shift register data input signal is taken from BF, BG, BH, BJ, respectively. Write strobe generators WB, WA generate write strobe signals WSF and WSG, WSH and WSJ, respectively. Signals WSF, WSG, WSH, WSJ strobe data into their respective function generators during a write cycle when the function generators are configured as RAM, and cause a shift when the function generators are configured as shift registers. The use of function generators as RAM is described in pages 4–11 through 4–23 of the Xilinx 1996 Data Book entitled "The Programmable Logic Data Book", available from Xilinx, Inc., 2100 Logic Drive, San Jose, Calif. 95124, which are incorporated herein by reference. The function generator of this embodiment can therefore be configured as a look-up table, a shift register, a 16×1 RAM, half of a 16×1 dual-ported RAM (when the two function generators in a slice are paired together), half of a 16×2 RAM, or half of a 32×1 RAM (when the two function generators in a slice are paired together). Not all combinations of function generator configurations are supported in a single slice. The supported combinations are detailed below.

In this embodiment, write strobe signals WSF and WSG are controlled by write strobe generator WB. A High (logic 1) pulse on function generator input WS causes a write to occur to the function generator look-up table, to either the first memory cell of the look-up table (if configured as a shift register) or to an addressed cell (if configured as a RAM). (See commonly assigned, co-pending U.S. patent application Ser. No. 08/754,421 entitled "Lookup Tables Which Double as Shift Registers", which is referenced above and incorporated herein by reference.)

Write strobe generator WB functions as follows in the supported combinations of function generator configurations: a) when function generators F and G are both configured as look-up tables, write strobe signals WSF and WSG are held Low (logic 0); b) when function generator G is configured as a 16×1 RAM or shift register and function generator F is configured as a look-up table, write strobe signal WSF remains Low while write strobe signal WSG pulses High when SR0 is active (Low or High, depending on whether multiplexer 60B is inverting or not) and CK0 makes the proper transition (falling or rising, depending on whether multiplexer 69B is inverting CK0 or not); c) when function generators F and G are configured as a dual-ported 16×1 RAM, a 16×2 RAM, or a pair of shift registers, write strobe signals WSF and WSG pulse High together when SR0 is active and CK0 makes the proper transition; d) when function generators F and G are configured as a single 32×1 RAM, one but not both of write strobe signals WSF and WSG pulses High, when SR0 is active and CK0 makes the proper transition. The generated High pulse occurs on write strobe signal WSF if multiplexer VF is non-inverting and input signal BF is High or if multiplexer VF is inverting and input signal BF is low, otherwise the High pulse occurs on write strobe signal WSG. As can be seen from the above description, SR0 acts as a write enable and CK0 acts as a clock to a synchronous RAM or shift register, while BF serves as a fifth address bit when the two function generators in a slice are configured as a 32-bit RAM.

Write strobe signals WSH and WSJ are generated by write strobe generator WA and controlled by input signals SR1, CK1, and BH, in a corresponding fashion.

AND gates 61F, 61G, 61H, 61J and multiplexers 81F, 81G, 81H, 81J, CF, CG, CH, CJ implement multiplier and carry logic functions as described in commonly assigned, co-pending U.S. patent application Ser. No. 08/786,818 entitled "Configurable Logic Block with AND Gate for Efficient Multiplication in FPGAs" by Chapman et al, which is referenced above and incorporated herein by reference. In FIGS. 4A and 4B, each of multiplexers 81F, 81G, 81H, 81J has separate programmable memory cells that determine the multiplexer output. In another embodiment, the two multiplexers in each slice (81F and 81G, 81H and 81J) share memory cells and therefore have the same programmed functionality.

In the embodiment of FIGS. 4A and 4B, each slice has a separate carry chain. One carry chain is from input signal CIN0 to output signal COUT0 and incorporates the outputs of function generators F and G. The other carry chain is from input signal CIN1 to output signal COUT1 and incorporates the outputs of function generators H and J. In one embodiment, the two carry chains are implemented as described in commonly assigned, co-pending U.S. patent application Ser. No. 08/494,131 entitled "Method and Structure for Providing Fast Propagation of a Carry Signal in a Field Programmable Gate Array" by Bernard J. New, which is referenced above and incorporated herein by reference.

Each slice further includes five-input-function multiplexer F5A, F5B and six-input-function multiplexer F6A, F6B. In FIG. 4A, multiplexer F6A receives an input signal on west-going line F5W from the output of multiplexer F5B in FIG. 4B. In FIG. 4B, six-input-function multiplexer F6B receives an input signal on east-going line F5E from the output of multiplexer F5A in FIG. 4A. Multiplexer F6A receives a second input signal from multiplexer F5A, and multiplexer F6B receives a second input signal from multiplexer F5B. Multiplexer F5A receives inputs from outputs O of function generators H and J. Multiplexer F5B receives inputs from outputs O of function generators F and G.

The CLE of this embodiment receives four extra control signals on lines BF, BH, BG, and BJ. These lines can be programmably inverted using multiplexers VF, VH, VG, and VJ, respectively, and control several useful functions. The five-input function multiplexers F5A, F5B are controlled by lines BH, BF, respectively. The six-input function multiplexers F6A, F6B are controlled by lines BJ, BG, respectively. A user can form a four-input multiplexer using multiplexer F5A and the outputs of function generators H and J, with function generators H and J each configured as a two-input multiplexer. Similarly, a four-input multiplexer can be formed using multiplexer F5B and the outputs of function generators F and G. A user can form an eight-input multiplexer using either multiplexer F6A or multiplexer F6B receiving inputs from both multiplexers F5A and F5B, each of which is receiving outputs from its respective function generators. Further, with multiplexer F5A, the memory cells in function generators H and J can operate as a 32-bit RAM. With multiplexer F5B, the memory cells in function generators F and G can operate as a 32-bit RAM. Lines BF, BH, BG, BJ serve as multiplexer control lines or RAM address lines, in addition to other functions as later described.

Registers RX, RY, RZ, RV generate outputs XQ, YQ, ZQ, VQ, respectively. Clock inputs to registers RX, RY, RZ, RV are designated by open triangles with apexes pointing into these registers. Clock enable inputs CE can be disabled using AND-gates 62A, 62B. (AND-gates 62A, 62B are controlled by a programmable memory cell that provides one of the inputs to each AND-gate.) Registers RX, RY, RZ, RV can be set or reset either synchronously or asynchronously through set port S or reset port R. (The choice of synchronous or asynchronous is made by a programmable memory cell shared between the two registers in each slice.) Set/reset input signals SR0, SR1 are controlled by multiplexers 60A, 60B and AND-gates 67A, 67B. Inputs SR0, SR1 (if enabled by AND-gates 67A, 67B) can set or reset the registers. Set/reset control units R81B, R82B, R81A, R82A are programmably controlled to either set or reset registers RX, RY, RZ, RV, respectively. Registers RX, RY, RZ, RV can also be configured as latches, the choice being made by a programmable memory cell shared between the two registers in each slice.

XOR gates SF, SG, SH, SJ generate the sum portion of an addition or multiplication, as described in commonly assigned, co-pending U.S. patent application Ser. No. 08/754,421 entitled "Lookup Tables Which Double as Shift Registers", which is referenced above and incorporated herein by reference.

Multiplexers MF, MG, MH, MJ select between signals to place onto output lines X, Y, Z, V, respectively. Multiplexers MF and MH select between the related function generator output signal, sum output signal, and five-input function multiplexer output signal. Multiplexers MG and MJ select between the related function generator output signal, sum output signal, and six-input function multiplexer output signal. The function generator F, G, H, J output signal is selected when a logical function of up to four inputs is chosen. The five-input function multiplexer F5A, F5B output signal is selected when one of a limited set of nine-input functions is chosen, including any logical function of five inputs, a 4-to-1 multiplexer, and any other function that can be implemented as two four-input functions feeding a 2-to-1 multiplexer. The six-input function multiplexer F6A, F6B output signal is selected when one of a limited set of 18-input functions is chosen, including any logical function of six inputs, an 8-to-1 multiplexer, and any other function that can be implemented as the output of two five-input function multiplexers F5A, F5B feeding a 2-to-1 multiplexer. The sum output signal of XOR gates SF, SG, SH, SJ is selected when an appropriate arithmetic operation such as addition, subtraction or multiplication is implemented.

Multiplexers OF, OG, OH, OJ allow the carry chain to bypass the related function generator. Multiplexers OF, OG, OH, OJ select whether the respective carry multiplexer CF, CG, CH, CJ is controlled by the function generator output signal O or whether the carry chain bypasses the function generator by propagating the carry-in signal to the next stage along the carry chain. Multiplexers CA, CB allow additional access onto their respective carry chains by selecting either a carry-in signal CIN0, CIN1 (buffered in this embodiment by inverters I121B and I122B, I121A and I122A, respectively) or an input signal BF, BH as the starting point for the carry chain in the CLE.

Multiplexers DF, DH select a signal to be loaded into related registers RX, RZ either from the outputs of multiplexers MF, MH, or from input signals BF, BH, respectively. Multiplexers DG, DJ select a signal to be loaded into related registers RY, RV either from the outputs of multiplexers MG, MJ, or from input signal lines BG, BJ, respectively.

Multiplexers BB, BA are bypass multiplexers that can apply carry-out signals COUT0, COUT1 to output lines YB, VB, or can forward input signals BG, BJ to output lines YB, VB to route a signal generated on one side of the CLE to a destination on the other side of the CLE.

AND-gates BRB, BRA allow input signals BG, BJ to serve as set/reset signals to registers RX, RY, RZ, RV, or alternatively allows input signals BG, BJ to be decoupled from registers RX, RY, RZ, RV so that input signals BG, BJ can be used for other purposes, such as controlling multiplexers F6B, F6A or providing a DI signal to function generators G, J, without setting or resetting the registers. A logic 0 in the memory cells controlling AND-gates BRB, BRA decouples lines BG, BJ from set/reset control units R81B, R82B, R81A, R82A; while a logic 1 in the associated memory cell enables AND-gates BRB, BRA to use the signals on BG, BJ to set or reset registers RX, RY, RZ, RV as determined by set/reset control units R81B, R82B, R81A, R82A.

Summary

The duplicated six-input-function multiplexer or function generator of the present invention offers the benefits of: 1) optionally implementing two different 6-input functions having five shared inputs and two shared 5-input multiplexers or function generators; 2) implementing an 8-to-1 multiplexer using only four 4-input function generators; 3) optionally implementing only one 6-input function but making the output thereof available at either of two exit points on an FPGA tile boundary, thereby reducing the number of required interconnect lines; 4) optionally selecting the six-input function multiplexer or function generator with the most advantageously placed unshared input; 5) a much simpler software model, with corresponding software speed and ease of software development; and 6) approximately equal delays between corresponding nodes in the two slices of the CLE, further simplifying FPGA mapping, placing, routing, and delay estimation software. Thus it will be understood that the present invention provides a new and useful method of generating 6-input functions in an FPGA CLE, and further provides a new and useful method of implementing an 8-to-1 multiplexer using only four 4-input function generators.

Those having skill in the relevant arts of the invention will now perceive various modifications and additions which may be made as a result of the disclosure herein of the preferred embodiment. Accordingly, all such modifications and additions are deemed to be within the scope of the invention, which is to be limited only by the appended claims and their equivalents.

What is claimed is:

1. A Configurable Logic Element (CLE) having first and second inputs, the CLE comprising:
    means for generating a first function of five first input signals;
    means for generating a second function of five second input signals, said second input signals being independent from said first input signals;
    means for generating a first 6-input function from said first input, said means for generating a first 5-input function, and said means for generating a second 5-input function; and
    means for generating a second 6-input function from said second input, said means for generating a first 5-input function, and said means for generating a second 5-input function.

2. The CLE of claim 1 wherein:
    said means for generating a first 6-input function comprises a first 2-to-1 multiplexer using said first input to select between said first 5-input function and said second 5-input function; and
    said means for generating a second 6-input function comprises a second 2-to-1 multiplexer using said second input to select between said first 5-input function and said second 5-input function.

3. A Configurable Logic Element (CLE) comprising:
    at least four function generators, each having no more than four inputs and at least one output; and
    means for combining no more than four of said function generator outputs to implement a dynamically controlled 8-to-1 multiplexer.

4. A Configurable Logic Element (CLE) comprising:
    first, second, third, and fourth function generators, each having up to four inputs and an output, each such function generator being capable of generating any function of up to four inputs;
    a first five-input-function multiplexer selecting at least between said outputs of said first and second function generators, thereby generating an output representing any function of up to five inputs;
    a second five-input-function multiplexer selecting at least between said outputs of said third and fourth function generators, thereby generating an output representing any function of up to five inputs; and
    first and second six-input-function multiplexers selecting at least between said outputs of said first and second multiplexers, thereby generating outputs representing any function of up to six inputs.

5. The CLE of claim 4 further comprising two slices, each said slice comprising two of said function generators, one of said first and second five-input-function multiplexers, and one of said first and second six-input-function multiplexers.

6. A Configurable Logic Element (CLE) comprising:
    first, second, third, and fourth function generators, each having up to four inputs and an output, said first, second, third, and fourth function generators being capable of generating any function of up to four inputs;
    a fifth function generator having as inputs at least said outputs of said first and second function generators, and further having an output;
    a sixth function generator having as inputs at least said outputs of said third and fourth function generators, and further having an output; and
    seventh and eighth function generators having as inputs at least said outputs of said fifth and sixth function generators.

7. The CLE of claim 6 further comprising two slices, each said slice comprising two of said first, second, third, and fourth function generators, one of said fifth and sixth function generators, and one of said seventh and eighth function generators.

8. A Configurable Logic Element (CLE) comprising:
    first, second, third, and fourth function generators, each having up to four inputs and an output, said first, second, third, and fourth function generators being capable of generating any function of up to four inputs;
    a fifth function generator having as inputs at least said outputs of said first and second function generators, and further having an output;
    a sixth function generator having as inputs at least said outputs of said third and fourth function generators, and further having an output; and
    first and second multiplexers selecting at least between said outputs of said fifth and sixth function generators.

9. The CLE of claim 8 further comprising two slices, each said slice comprising two of said first, second, third, and fourth function generators, one of said fifth and sixth function generators, and one of said first and second multiplexers.

10. Configurable Logic Element (CLE) comprising:
    first, second, third, and fourth function generators, each having up to four inputs and an output, said first, second, third, and fourth function generators being capable of generating any function of up to four inputs;
    a first multiplexer selecting at least between said outputs of said first and second function generators, thereby generating an output representing any function of up to five inputs;
    a second multiplexer selecting at least between said outputs of said third and fourth function generators, thereby generating an output representing any function of up to five inputs; and
    fifth and sixth function generators having as inputs at least said outputs of said first and second multiplexers.

11. The CLE of claim 10 further comprising two slices, each said slice comprising two of said first, second, third, and fourth function generators, one of said first and second multiplexers, and one of said fifth and sixth function generators.

* * * * *